(12) United States Patent
Lakin (10) Patent No.: US 6,720,844 B1
(45) Date of Patent: Apr. 13, 2004

(54) COUPLED RESONATOR BULK ACOUSTIC WAVE FILTER

(75) Inventor: Kenneth Meade Lakin, Redmond, OR (US)

(73) Assignee: TFR Technologies, Inc., Bend, OR (US)

( * ) Notice: Subject to any disclaimer, the term of this patent is extended or adjusted under 35 U.S.C. 154(b) by 0 days.

(21) Appl. No.: 09/990,923

(22) Filed: Nov. 16, 2001

(51) Int. Cl.[7] .............. H03H 9/48; H03H 9/56; H03H 9/70
(52) U.S. Cl. .......... 333/189; 333/191; 333/133; 310/328; 310/335
(58) Field of Search .............. 333/186–192, 333/133; 310/323, 328, 334, 335

(56) References Cited

U.S. PATENT DOCUMENTS

| | | | |
|---|---|---|---|
| 3,414,832 A | 12/1968 | Newell | 330/286 |
| 3,568,108 A * | 3/1971 | Poirier et al. | 333/187 |
| 3,694,677 A | 9/1972 | Guttwein et al. | 310/369 |
| 3,699,484 A * | 10/1972 | Berlincourt | 333/187 |
| 4,349,796 A | 9/1982 | Chin et al. | 333/186 |
| 5,373,268 A | 12/1994 | Dworsky et al. | 333/187 |
| 5,608,362 A * | 3/1997 | Nishimura et al. | 333/191 |
| 5,821,833 A | 10/1998 | Lakin | 333/187 |
| 5,864,261 A * | 1/1999 | Weber | 333/187 |
| 5,894,647 A | 4/1999 | Lakin | 29/25.35 |
| 6,291,931 B1 | 9/2001 | Lakin | 310/364 |
| 6,492,759 B1 * | 12/2002 | Watanabe | 310/320 |

* cited by examiner

*Primary Examiner*—Barbara Summons
(74) *Attorney, Agent, or Firm*—Ronald M. Goldman; G. Joseph Buck (57) ABSTRACT

A microwave filter made of acoustically coupled, bulk wave acoustic resonators. The resonators utilize piezoelectric materials sandwiched between conducting electrodes. Layers of material that intervene between the resonators control the amount of acoustic coupling between the resonators and the amount of coupling is selected to obtain desired filter characteristics. The resonators and the intervening layers may be supported upon a substrate by means of a series of layers of material that function as an acoustic mirror or reflector.

16 Claims, 12 Drawing Sheets

FIG. 1

PRIOR ART

FIG. 2

PRIOR ART

TABLE OF MATERIAL VALUES

Figure 9:
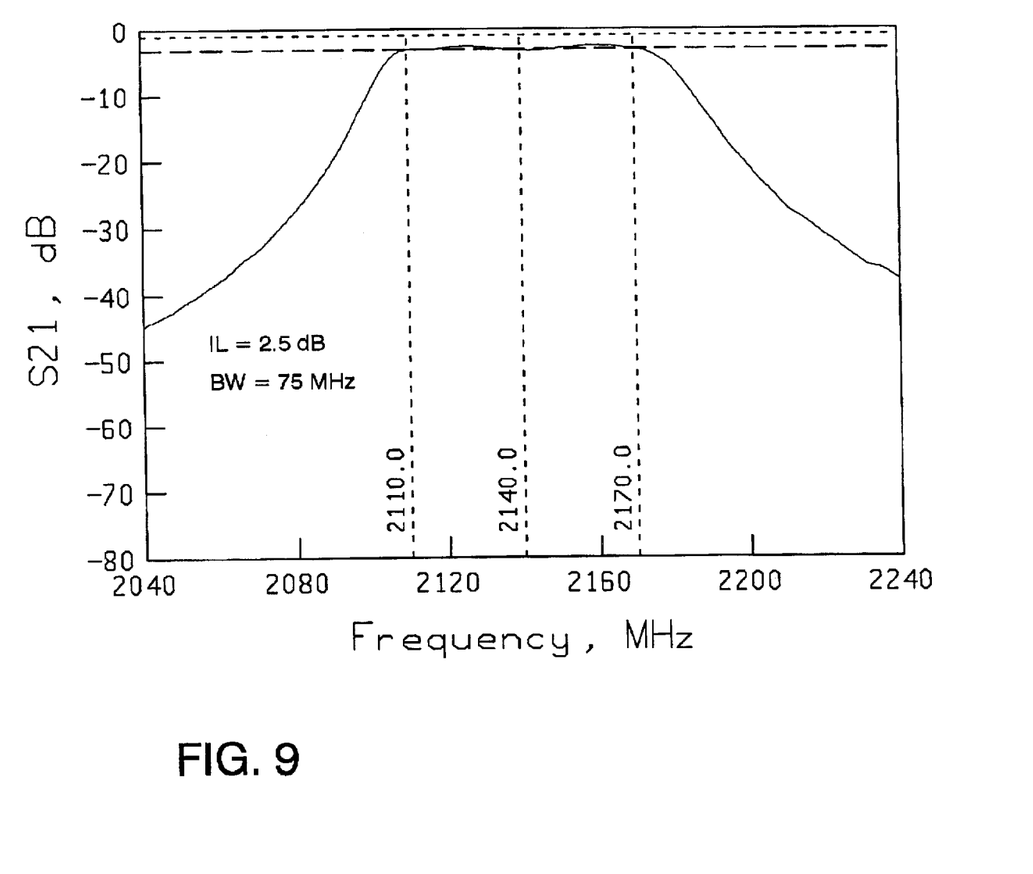
FIG. 9 depicts the measured transfer characteristic for an experimental filter fabricated as a pair of acoustically coupled resonators electrically connected in series with a second pair of acoustically coupled resonators and designed to provide a filter with its pass-band centered at 2,140 Mhz. The filter is configured in the manner depicted in FIG. 4 with the electrodes configured as depicted in FIG. 6.

| Layer (a) | Impedance(b) | Material | Fig. 9 Thick. (c) | Fig. 10 Thick. (c) | Fig. 11 (h) Thick. (c) | Fig. 11 (i) Thick. (c) |
|---|---|---|---|---|---|---|
| 404/424 | 17.3 | Al | 0.22 | 0.52 | 0.28 | 0.21 |
| 402 | 36.8 | AlN | 2.22 | 5.0 | 2.47 | |
| 403/407 | 17.3 | Al | 0.22 | 0.52 | 0.295 | 0.205 |
| 450 | 12.7 | SiO2 | 0.69 | 1.56 | 0.766 | |
| 451 | 32.7 | AlN (d) | 1.28 | 2.9 | 1.425 | |
| 452 | 4.06 | LDO (e) | 0.34 | 0.77 | 0.377 | |
| 440 | 17.3 | Al | 0.22 | 0.52 | 0.295 | 0.205 |
| 406 | 36.8 | AlN | 2.22 | 5.0 | 2.47 | |
| 441 | 17.3 | Al | 0.22 | 0.52 | 0.295 | 0.205 |
| 408 | 12.7 | SiO2 | 0.69 | 0.77 (g) | 0.766 | |
| 409 (f) | 32.7 | AlN (d) | 1.28 | 2.9 | 1.425 | |
| 410 | 12.7 | SiO2 | 0.69 | 1.56 | 0.766 | |

Figure 4:
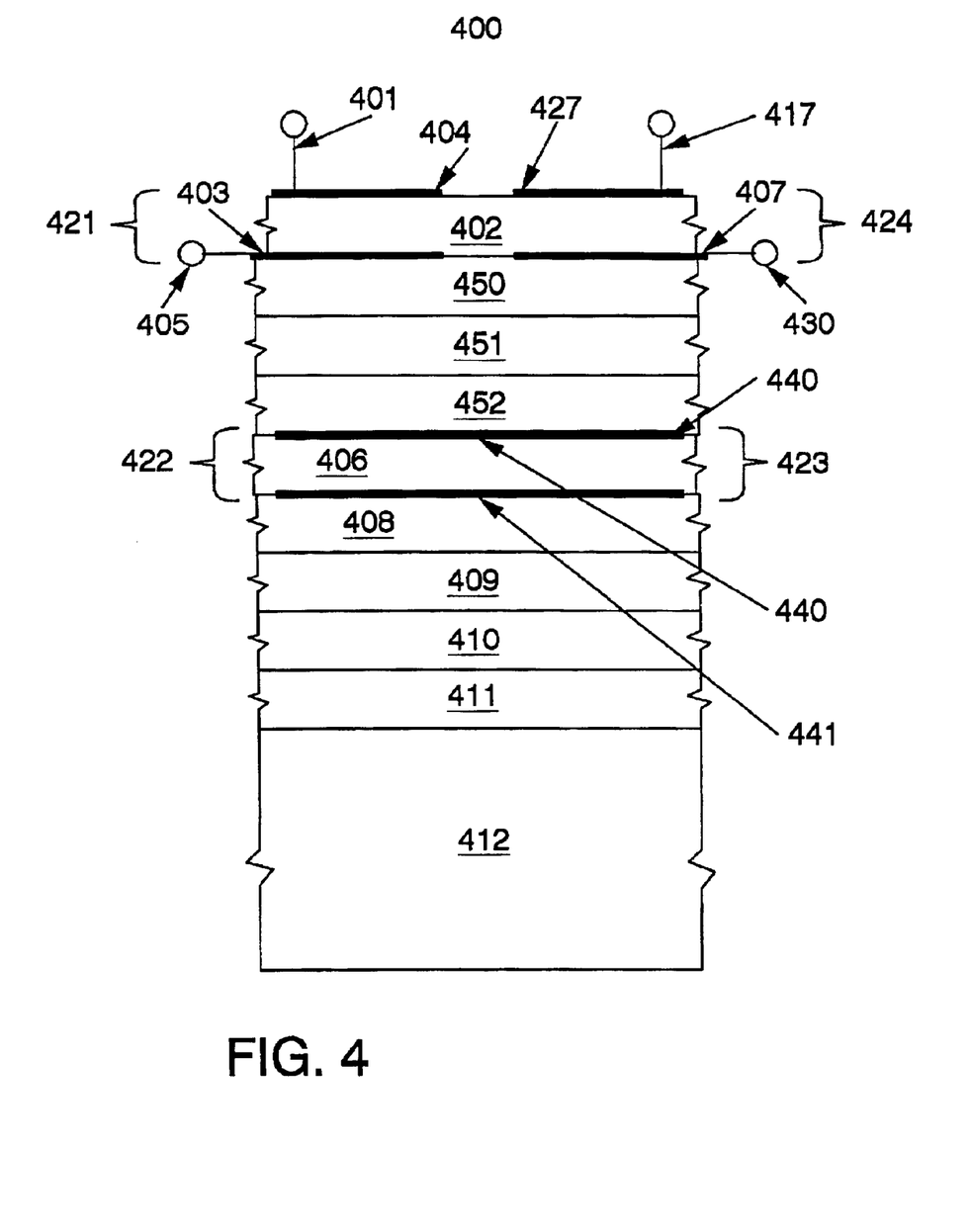
FIG. 4 depicts two sets of acoustically coupled bulk acoustic wave resonators, which sets are electrically connected in series with each other to make a filter having both input and output ports located upon the upper surface of the device.
Figure 6:
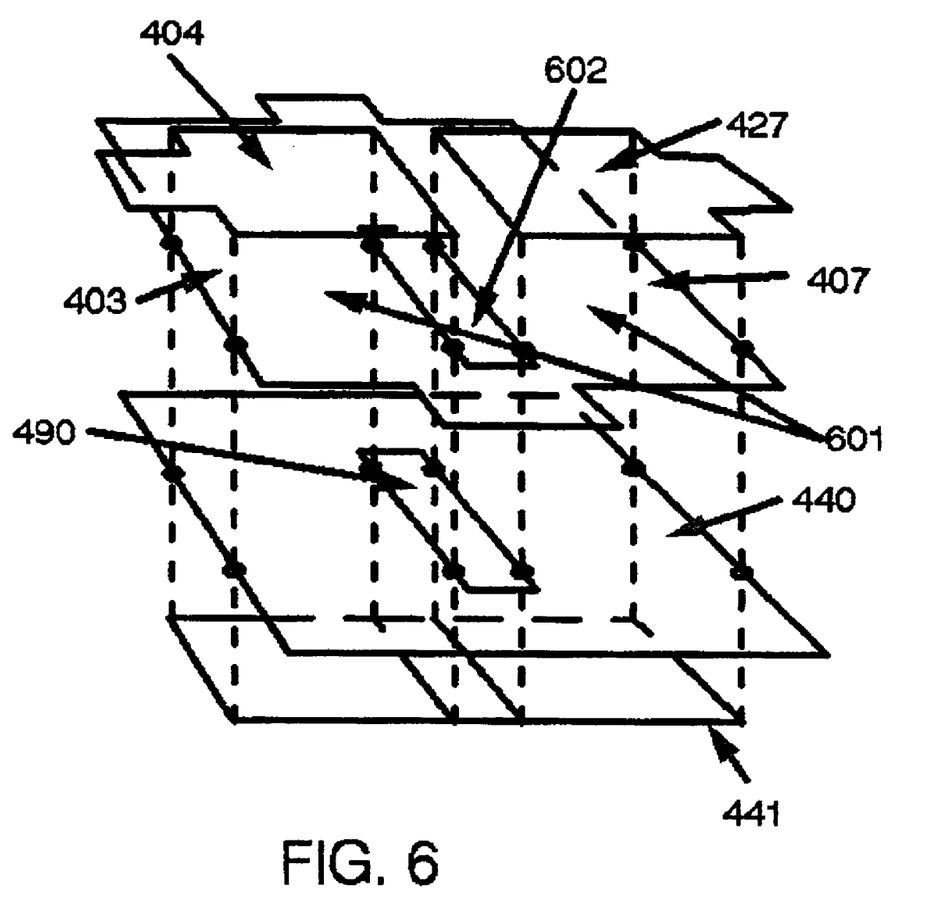

Notes:

(a) Refer to Fig. 4 and Fig. 6 for layer designations
(b) Mechanical impedance in units of (1E5cm/sec)(gm/cm3)
(c) Layer thickness in units of micrometers
   Reflector and coupler layers are quarter wavelength thick at center frequency.
   For Fig. 11, the quarter wavelength frequency is 1920 MHz.
(d) Polycrystalline form of AlN, non-piezoelectric
(e) Low density oxide used as low dielectric constant isolation layers in microelectronics.
(f) From 409 to the substrate are eight quarter wavelength thick layers in the 409/410 materials sequence.
(g) LDO material in this layer
(h) For filter 91
(i) For filter 92 showing only values changed from those for filter 91.

Fig. 12

COUPLED RESONATOR BULK ACOUSTIC WAVE FILTER

CROSS-REFERENCES TO RELATED APPLICATIONS

Not Applicable

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of a contract awarded by an agency of the U.S. Government.

REFERENCE TO A "MICROFICHE APPENDIX"

Not Applicable

BACKGROUND OF THE INVENTION

1. Field of the Invention

The invention pertains to thin film acoustic devices. More particularly this invention pertains to thin film, bulk wave acoustic resonators for use as filters at microwave frequencies. A thin film, bulk wave acoustic resonator typically utilizes a thin layer of piezoelectric material that is sandwiched between two thin conducting layers of material to form a resonator. The conducting layers serve as electrodes and when an electrical voltage, at a microwave frequency, is applied between the two electrodes, the consequent electric field between the electrodes interacts with the piezoelectric material to generate acoustic waves within the piezoelectric material. In a bulk wave, acoustic resonator, acoustic waves propagate in the direction normal to the thin layers of material and the electrical impedance between the two electrodes exhibits a resonance when the acoustic thickness of the combination of the piezoelectric layer and of the two electrodes is approximately one-half of an acoustic wavelength or an odd multiple thereof. In some instances the acoustic waves are acoustic shear waves and in other instances the acoustic waves are acoustic longitudinal waves.

2. Description of the Prior Art

The fabrication of piezoelectric resonators for use at microwave frequencies is well known in the prior art. See, e.g., the descriptions of such devices in the specification of U.S. Pat. No. 5,894,647 for a "Method for Fabricating Piezoelectric Resonators and Product", Lakin, and see the references to prior art cited therein. See also "Microwave Acoustic Resonators and Filters," by Lakin, Kline and McCarron, IEEE Trans. on Microwave Theory and Techniques, Vol. 41, No. 12, December 1993, p. 2139; Guttwein, Ballato and Lubaszek, U.S. Pat. No. 3,694,677; and "Acoustic Bulk Wave Composite Resonators", Applied Physics Letters 38(3) by Lakin and Wang, Feb. 1, 1981. Such resonators also may be fabricated on, and supported by a substrate by including a set of intervening layers of material having alternating high and low acoustic impedances, which layers have thicknesses of a quarter wavelength. The intervening layers act as an acoustic mirror that acoustically isolates the resonator from the underlying substrate. See, e.g., U.S. Pat. Nos. 3,414,832 and 5,373,268 and 5,821,833 and 6,291,931. For methods of analysis and further descriptions of reflectors and resonators see Lakin, "Solidly Mounted Resonators and Filters, 1995 IEEE Proc. Ultrasonics Symposium, pp. 905–908 and Lakin et al. "Development of Miniature Filters for Wireless Applications", IEEE Trans. on microwave Theory and Techniques, Vol. 43, No. 12, December 1996, pp. 2933–2939.

Figure 1:
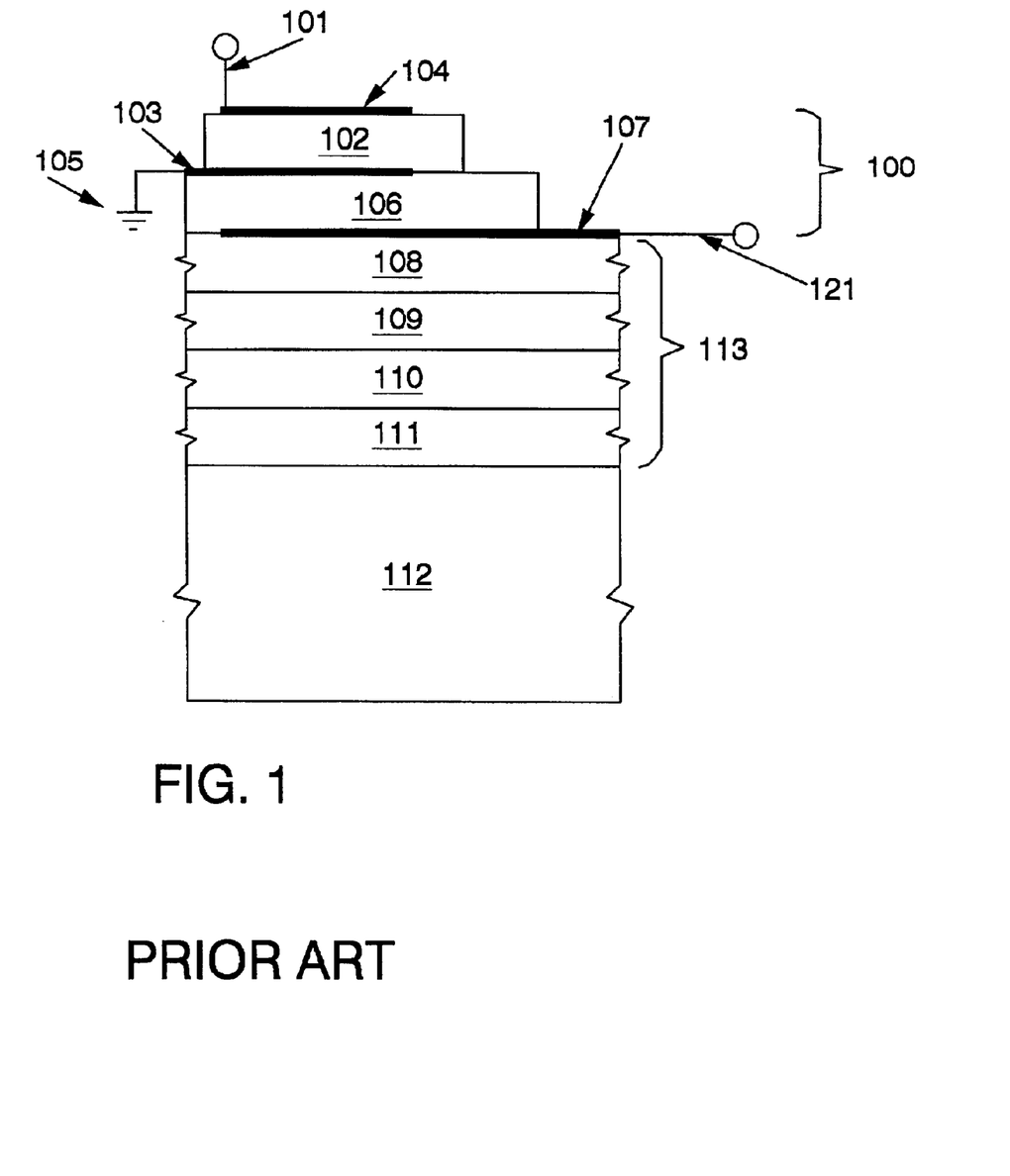
FIG. 1 depicts a stacked crystal filter of the prior art.

As depicted in FIG. 1 hereof, U.S. Pat. No. 5,821,833, for A Stacked Crystal Filter Device and Method of Making, Lakin, disclosed a bulk acoustic wave, stacked crystal filter 100, a supporting substrate 112 and an acoustic reflector 113 located between stacked crystal filter 100 and the substrate. Acoustic reflector 113 was made of a sequence of layers 108, 109, 110 and 111 of material having alternately high and low acoustic impedance. The stacked crystal filter comprised two layers 102 and 106 of piezoelectric material separated by a conducting electrode layer 103 and bounded on the top and bottom by conducting electrode layers 104 and 107. The top and middle electrodes provided a signal input port 101 and the middle and bottom electrodes provided a signal output port 121 with the middle electrode layer 103 being connected to signal ground 105. The stacked crystal filter exhibited high transmission of signals from the input port to the output port for the signal frequency at which the combined thicknesses of the two piezoelectric layers and of the three electrode layers constituted approximately one-half an acoustic wavelength. The stacked crystal filter, by itself, also would have transmitted frequencies which were approximately an integral multiple of said frequency for which the combined thicknesses were approximately an integral multiple of one-half an acoustic wavelength.

The thickness of each layer of material in the reflector was one-quarter of an acoustic wavelength at the frequency at which the stacked acoustic resonator had a thickness of one acoustic wavelength and at this frequency the upper surface of the reflector exhibited a very low impedance that reflected substantially all of the acoustic wave from the resonator incident upon the reflector. As a consequence the reflector facilitated the transmission of signals by the stacked acoustic resonator at that frequency. However, the transmission by the filter of signals at higher frequencies for which the resonator thickness was two, three or more times a half acoustic wavelength, were inhibited because at these higher frequencies the layers of material underlying the stacked crystal filter did not operate as a reflector and did not isolate the acoustic vibrations of the stacked crystal filter from the underlying substrate.

Figure 2:
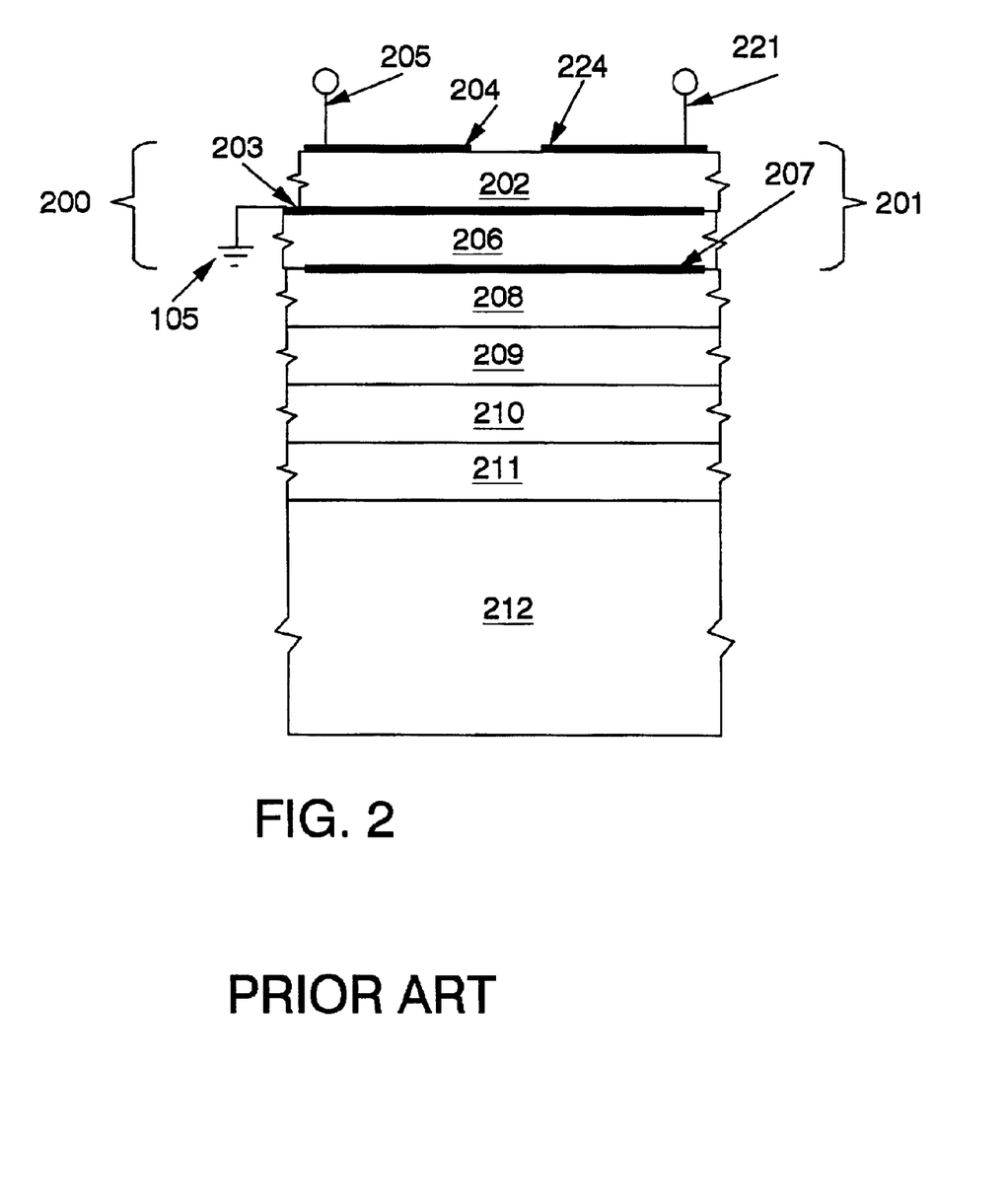
FIG. 2 depicts two stacked crystal filters connected in series to provide both input and output ports located upon the upper surface of the device.

A different example of prior art is depicted in FIG. 2. In this example a pair of stacked crystal filters 200 and 201 were mounted side by side upon a reflector comprising layers 208, 209, 210 and 211 mounted on substrate 212 and connected electrically together in the manner depicted in FIG. 2 to provide a filter in which the input port 205 to stacked filter 200 and the output port 221 from stacked filter 201 are both located on the upper surface of the device. Electrode 204 and the underlying portions of piezoelectric layers 202 and 206 and the underlying portions of electrodes 203 and 207 comprise the two resonators within stacked filter 200. Electrode 224 and the underlying portions of piezoelectric layers 202 and 206 and the underlying portions of electrodes 203 and 207 comprise the two resonators within stacked filter 201. As depicted in FIG. 2, electrodes 203 and 207 each constitute parts of both stacked crystal filters and provide direct electrical connections between the two stacked crystal filters. Because there are no intervening layers between the two resonators within each stacked crystal filter (other than the conducting electrode 203, the degree of the coupling between the two resonators in each stack is fixed and may not be adjusted. As a consequence the range of filter characteristics that may be achieved by this configuration is limited.

U.S. Pat. No. 3,568,108 for a "Thin Film Piezoelectric Filter", Poirier, disclosed the use of piezoelectric semiconductors for use in resonators. The patent places special importance upon the fact that the resonator in the patented device utilizes piezoelectric layers which are also semiconductors. The patent specification states that it is a characteristic of piezoelectric semiconductor materials that an acoustic wave propagating through the material generates a piezoelectric field which interacts and exchanges energy with mobile charge carriers driven through the medium by an external DC electric field and states that when a DC voltage is applied to the medium it creates a direct current [col. 1, ln. 48–57]. The sole independent claim of the patent recites resonators that include an epitaxial film having both piezoelectric and semiconductive properties [col. 4, ln. 25–26]. Accordingly, the '108 patent discloses resonators that utilize piezoelectric that are also semiconductors having semiconductive properties. The '108 patent does not disclose resonators that use piezoelectric materials that are insulators.

The '108 patent discloses a filter comprising an input resonator and an output resonator and the specification states that the input rf electrical signal is filtered by virtue of the different acoustical frequency-amplitude characteristics of the (two) resonators [col. 4, ln 5–9]. Unfortunately the specification does not clearly identify the elements that comprise each resonator and the nature of these elements. At one point the specification appears to disclose two resonators that are in surface contact with each other [col. 3, ln. 31–33 and see the areas encompassed by numbers 41 and 42 in FIG], while, in apparent contradiction, independent claim 1 recites means disposed between the resonators [col.4, ln. 35–36] and dependent claim 4 describes said means as comprising a plurality of layers [col. 4, ln. 52–54]. At one point the specification indicates that each of the layers of material that intervene between the resonator electrodes has a thickness of between $(2n+1)/4$ and $(n+1)/2$ acoustic wavelengths [col. 3, ln. 52–54], while at another point the specification indicates that each of these intervening layers has a thickness of one-half acoustic wavelength [col. 3, ln. 63–65]. As a consequence, it is difficult to determine with certainty just what art was disclosed in the specification.

In any case the specification states that the extend (sic-extent) to which the frequency-amplitude characteristics of the resonators overlap substantially determines the electrical characteristics of the filter [col. 4, ln. 7–9]. It is not apparent whether the foregoing statement is based on the fact, or perhaps the assumption, that an interaction between the rf electric fields and a DC flow of mobile carriers within the piezoelectric semiconductors would cause the coupling between the resonators to be unidirectional, thus causing the resonators to exhibit a filter characteristic that was simply the product of the resonance properties,of the two resonators, or instead was based upon an assumption that the two resonators were only weakly coupled to each other. Or perhaps this statement was based upon some other undisclosed element or characteristic of the device. In any case, the patent does not disclose the use of an insulating piezoelectric material in the resonators, and does not disclose the use of intervening layers of material between a pair of resonators, the parameters of which intervening layers are selected to control the coupling between the resonators so as to produce a filter whose transfer characteristic is not simply the product of the frequency responses of the individual resonators.

U.S. Pat. No. 4,349,796 for Devices Incorporating Phonon Filters, Chin et al., disclosed the use of a superlattice of one-hundred alternating layers of GaAs and AlGaAs. The superlattice was located between a superconducting tunnel junction that generated acoustic wave phonons at one end of the superlattice and a second superconducting tunnel junction that was located at the other end of the superlattice and detected phonons that passed through the superlattice. The patent specification described a superlattice, in which each layer had a thickness of one-quarter of an acoustic wavelength and that selectively reflected phonons to produce a quasi-monochromatic source of phonons. The patent also described a superlattice, in which each layer had a thickness of one-half of an acoustic wavelength, that selectively transmitted phonons through the lattice to provide a quasi-monochromatic source of phonons. The present invention differs from the device disclosed in the '796 patent because the present invention uses acoustic resonators, instead of superconducting tunnel junctions, as input and output devices. Furthermore, the present invention uses a small number of intervening layers of material to adjust the bilateral acoustic coupling between the acoustic resonators so that the frequency response characteristics of the closely coupled resonators produce the desired filtering properties between the input and output ports of the device. In contrast to the present invention, in the '796 device the superlattice, itself, provides the frequency selective properties of the device.

BRIEF SUMMARY OF THE INVENTION

The present invention utilizes thin-film, bulk acoustic wave resonators that use piezoelectric materials that are insulators and not semiconductors and that, as a consequence, avoid the debilitating losses that otherwise would result from the use of semiconducting piezoelectric materials. The terms "insulator" or "insulators" are used herein with respect to a piezoelectric material as meaning a material for which the conductivity is low enough such that the interaction of any conductive current with acoustic waves propagating at microwave frequencies within the material would be insufficient to create a significant asymmetry in the acoustic properties of the material and would normally not constitute the major loss mechanism for acoustic waves propagating through the material. For the purposes of this invention, an insulator means a material that has a dielectric relaxation frequency that is less than one-tenth of the frequency of the acoustic wave propagating through the material.

In this device, the layers of material intervening between the two resonators are selected to control the acoustic coupling between the two resonators so that the coupled resonators produce a filter transfer characteristic, $S_{21}$, that is more complex than simply the product of the frequency responses of the two, individual resonators. By adjusting the degree of the coupling between the resonators to be substantially equal to or greater than critical coupling, the transfer characteristic for the filter can be specially adapted to many applications. For example, the transfer characteristic of this device can have a broader peak and steeper sides than could be obtained by using two resonators that are only weakly coupled together or for which the coupling between the resonators is not bilateral.

DETAILED DESCRIPTION OF THE INVENTION

Figure 3:
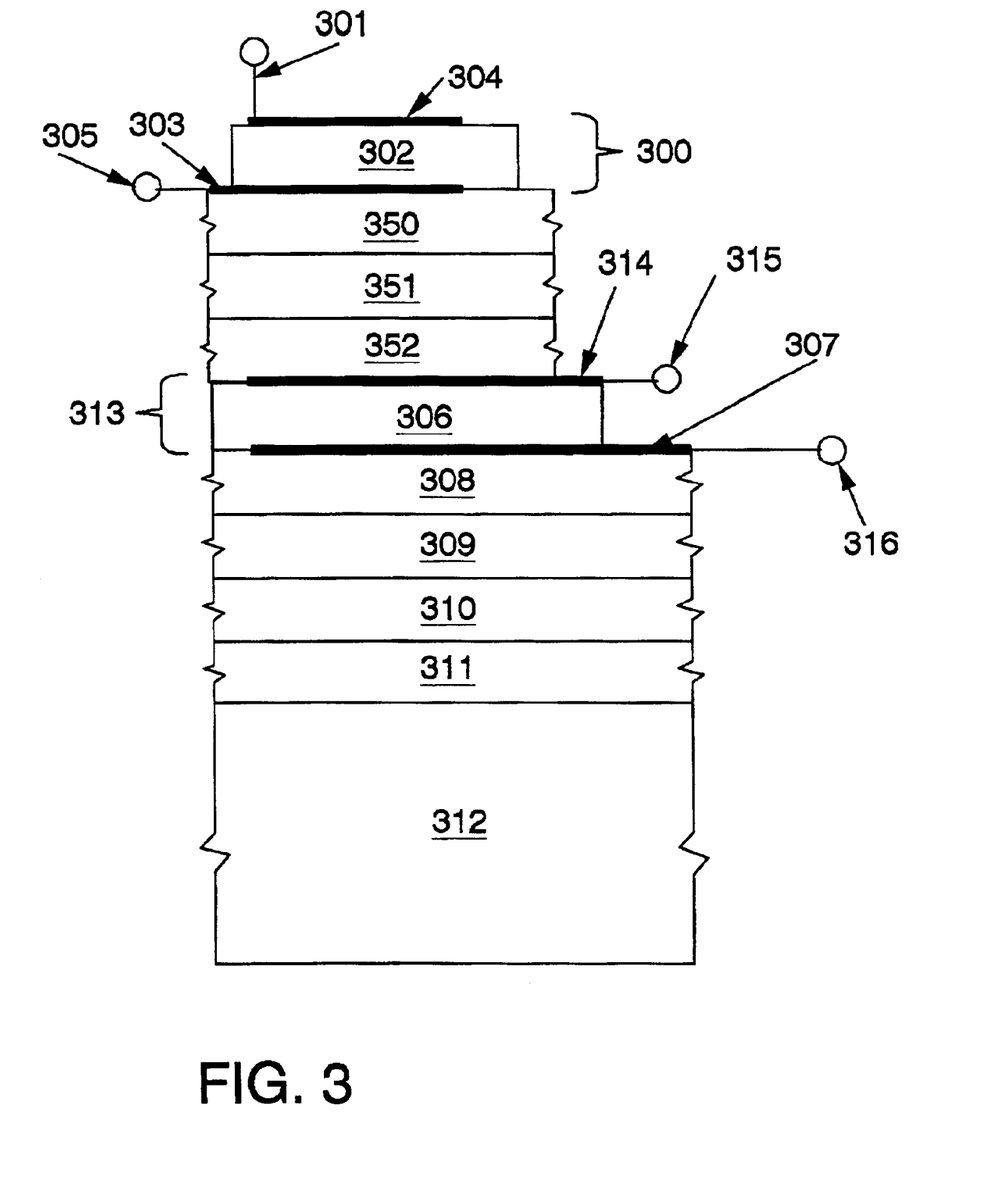
FIG. 3 depicts one embodiment of the present invention, namely a filter comprised of two acoustically coupled bulk acoustic wave resonators separated by intervening layers of material that control the amount of acoustic coupling between the resonators, which filter is supported by an acoustic reflector mounted upon a substrate.

FIG. 3 depicts one embodiment of the filter comprising this invention. Resonator 300 consists of electrodes 304 and 303 located upon the upper and lower surfaces of a piezoelectric layer 302 of material and that portion of piezoelectric layer 302 that is sandwiched between the overlapping portions of electrodes 304 and 303. Connectors 301 and 305 provide electrical connections to resonator 300 and operate as an input port. Resonator 313 consists of electrodes 314 and 307 located upon the upper and lower surfaces of piezoelectric layer 306 together with that portion of piezoelectric layer 306 that is sandwiched between the overlapping portions of electrodes 314 and 307. Connectors 315 and 316 provide electrical connections to resonator 313 and operate as an output port. Piezoelectric layers 302 and 306 are made of a piezoelectric material, such as AlN, ZnO, $LiNbO_3$, in a form such that the material constitutes an insulator and not a semiconductor. The piezoelectric material in piezoelectric layer 302 may be, but need not be, the same as the piezoelectric material in piezoelectric layer 306.

Because the resonators 300 and 313 exhibit an acoustic resonance at signal frequencies for which the combined thickness of the layer of piezoelectric material and the bounding electrodes is approximately one-half of an acoustic wavelength, or an odd integral multiple thereof, an electrical signal input to the input port is filtered by these acoustic resonances so that a substantial amount of the input signal is transferred to the output port only for frequencies near which the acoustic resonators resonate. The input and output ports of this filter could, of course, be interchanged.

Resonators 300 and 313 are separated by intervening layers 350, 351 and 352 of material having various acoustic impedances and nominal thicknesses of one-quarter acoustic wavelength at the center frequency of the operation of the filter. As illustrated in FIG. 3, layer 351 is contiguous with layer 350, which layer 350 is disposed above layer 351. Layer 351 is also contiguous with layer 352, which layer 352 is disposed below layer 351. The acoustic impedance of one or more of layers 350, 351 and 352 is adjusted or selected so as to achieve the desired degree of coupling between resonator 300 and resonator 313 to obtain a desired filter bandpass characteristic. The acoustic impedance of these layers can be adjusted by changing the growth parameters and/or by selecting the materials comprising these various distinct layers. Although this example uses three intervening layers, it should be understood that the filter might use a fewer or greater number of intervening layers to obtain the desired degree of coupling between the resonators.

Figure 8:
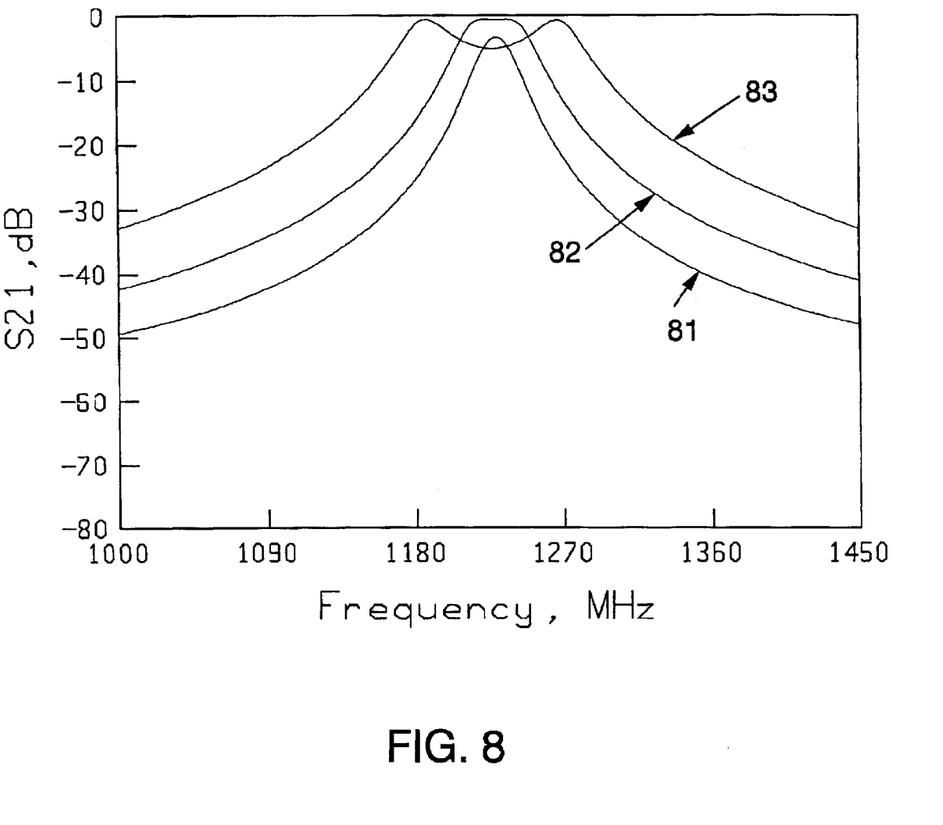
FIG. 8 depicts examples of the filter transfer characteristic, $S_{21}$, for a pair of resonators having various amounts of acoustic coupling between the resonators.

FIG. 8 depicts calculated values of the filter transfer characteristic, $S_{21}$, for example devices similar to the one depicted in FIG. 3 in which the number and composition of the intervening layers has been selected to provide different amounts of acoustic coupling between the resonators. Curve 83 depicts the transfer characteristic provided by a device that utilized a single intervening layer to provide a high degree of coupling, curve 82 depicts the transfer characteristic provided by three intervening layers to provide a lesser degree of coupling, and curve 81 depicts the transfer characteristic obtained using 5 intervening layers to provide even less coupling between the resonators. Curve 81 has a single, relatively narrow peak and exemplifies a pair of resonators that are under-coupled. Curve 82 has a broad and flat peak and exemplifies a pair of resonators that are critically-coupled and curve 83, which has a still broader width and which exhibits two adjacent peaks with a dip between the peaks, exemplifies two resonators that are over-coupled. The terms under-coupled, critically-coupled and over-coupled are use here by analogy to the manner in which such terms are used in the analysis of coupled resonant electrical circuits, see, e.g., "Electronic and Radio Engineering", by Frederick Terman, McGraw-Hill, 4th Ed., section 3–5, pp. 63–74. The transfer characteristic for the coupled resonators using a particular number of intervening layers could, of course, be further modified by changing the composition and thicknesses of the intervening layers.

Layers 308, 309, 310 and 311 each have a thickness of approximately one-quarter acoustic wavelength at the center frequency of the filter pass-band and the layers have alternating high and low acoustic impedances. The layers 308 through 311 together act as an acoustic mirror or acoustic reflector to isolate the vibrations of the resonators from the underlying substrate 312. It should be understood that such the reflector could, instead, comprise a lesser or greater number of layers.

FIG. 4 depicts the preferred embodiment 400 of the invention, which embodiment consists of the duplication, side by side, of the pair of resonators depicted in FIG. 3 and the electrical connection in series of these two pairs of resonators to form a filter. The first pair of coupled resonators 421 and 422 is connected in series with the second set of coupled resonators 423 and 424 by means of the electrical continuity of electrodes 440 and 441, which electrodes bound both resonators 422 and 423 and also electrically connect the signal output from resonator 422 to the input of resonator 423. Electrodes 404 and 403 provide a signal input port to the entire device via connectors 401 and 405 and electrodes 427 and 407 provide a signal output port for the entire device via connectors 430 and 417. Layer 402 is sandwiched between electrodes 403 and 404 and between electrodes 407 and 427.

Intervening layers 450, 451 and 452 are each approximately one-quarter acoustic wavelength in thickness at the center frequency of the filter pass-band and the acoustic impedances of these various distinct layers are selected to provide the desired degree of coupling between resonators 421 and 422 and between resonators 423 and 424. As in the prior embodiment, layer 451 is contiguous with both layer 450 located above, and layer 452 located below, layer 451. It should be understood that more or less than three intervening layers of material could be used for this purpose and that the nominal thicknesses of these layers need not necessarily be one-quarter acoustic wavelength. For example, in an instance where four intervening layers provide too little coupling between the resonators and three intervening layers provide too much coupling, the thicknesses of one or more of the intervening layers could be adjusted to "fine tune" the coupling to obtain the desired amount of coupling between the resonators. It should also be understood that the portions of layers 450, 451 and 452 that lie between resonators 421 and 422 need not be the same in composition, thickness or number as compared to the portions of these layers that lie between resonators 423 and 424.

Layers 408, 409, 410 and 411 act as an acoustic mirror or reflector to isolate the vibrations of the resonators from the underlying substrate 412.

Figure 5:
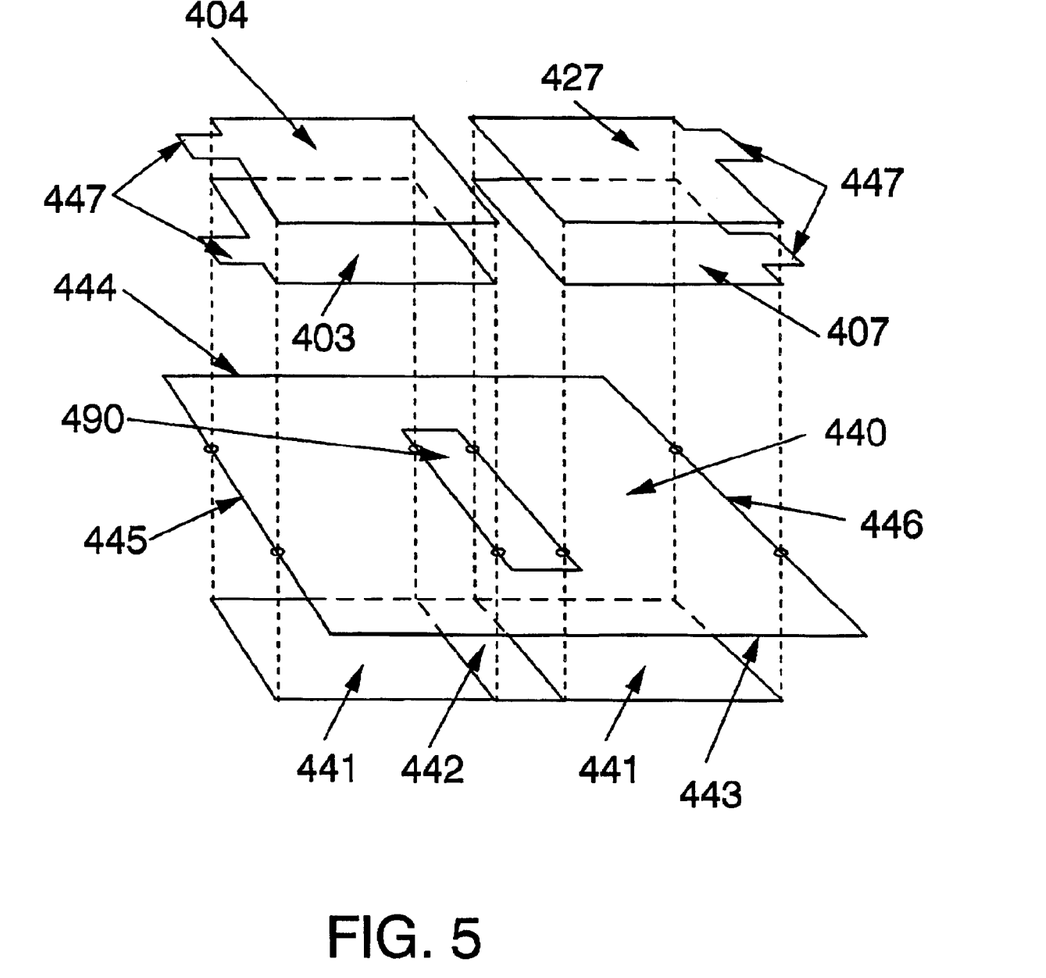
FIG. 5 conceptually depicts the configuration of the conducting electrode layers of one embodiment of the invention and FIG. 6 similarly depicts another configuration of these electrodes.

Although in FIG. 4 each of electrodes 440 and 441 is depicted as a uniform conducting layer, the transverse boundaries of each electrode are configured so as to avoid creating parasitic resonators within the region not underlying either resonator 421 or resonator 424. FIG. 5 depicts how the transverse boundaries of the various electrodes depicted in FIG. 4 are arranged so as to avoid the creation of parasitic resonators that otherwise might degrade the performance of the filter. FIG. 5 conceptually (i.e. the thicknesses of the electrodes are not depicted) depicts only the electrodes and omits the piezoelectric layers, omits the various other intervening layers, omits the layers comprising the reflector and omits the substrate. The transverse dimensions of the omitted layers and of the substrate need not be bounded in the manner depicted in FIG. 5 and may, instead, extend beyond the transverse dimensions of the various electrodes. The electrodes in FIG. 4 that are depicted in FIG. 5 are identified by the same numbers in both figures.

Referring now to FIG. 5, with the exception of the connector tabs 447 extending from the sides of electrodes 404, 403, 427 and 407, and the connecting portion 442 of electrode 441, the transverse boundaries of electrode 404 coincide with the transverse boundaries of electrode 403 and the outer transverse boundary of electrode 441. With similar exceptions, the transverse boundaries of electrode 427 coincide with the transverse boundaries of electrode 407 and the outer transverse boundary of electrode 441. The transverse boundaries of electrode 441 include the connecting portion 442, which connecting portion electrically connects the portions of electrode 441 that respectively underlie electrodes 404 and 427. Electrode 440 has a void 490, two boundaries of which void 490 coincide with the boundaries of electrodes 404 and 427 that are adjacent to each other. The remaining two boundaries of void 490 coincide with, or extend outside of, the nearby boundaries of electrode 441. The void 490 in electrode 440 prevents the underlying portion of piezoelectric layer 406 and the underlying portion of electrode 441, namely the connecting portion 442, from acting as a parasitic acoustic resonator. Thus void 490 acoustically separates the operation of resonator 422 from resonator 423. However, because void 490 does not electrically separate the portion of electrode 440 that comprises part of resonator 422 from the portion of electrode 440 that comprises part of resonator 423, these two resonators are electrically, but not acoustically, connected. Boundaries 443 and 444 of electrode 440 extend beyond the respective nearby boundaries of electrode 441. Boundaries 445 and 446 coincide with the respective nearby boundaries of electrode 441 and thereby avoid the formation of parasitic resonators that otherwise might be created in those portions of the piezoelectric layers that underlie the tabs extending from the sides of electrodes 403, 404, 407 and 427. In some circumstances the boundaries 445 and 446 of electrode 440 could be extended outside of the respective boundaries of electrodes 403, 404, 407 and 427. However, to avoid the possible creation of parasitic resonances, one then might include voids in those portions of layer 440 that underlie the tabs extending from the sides of electrodes 403, 404, 407 and 427 so as reduce the likelihood that the portions of electrode 440 underlying these tabs might contribute unwanted capacitance between electrode 440 and these tabs or, where piezoelectric material is situated between one or more of the tabs and electrode 440, might create parasitic resonators.

FIG. 4 depicts two pairs of coupled resonators in which first pair is located beside the second pair and utilizes electrodes and layers of material that appear to have the same thickness in the first pair as they have in the second pair of resonators. It should be understood, however, that the device could, instead, be fabricated such that these thicknesses are not necessarily the same for these two pairs of resonators. For example, electrodes 427 and 407 could be fabricated to have greater thicknesses than the corresponding electrodes 403 and 404, which would cause the resonant frequency of resonator 424 to be slightly lower than the resonant frequency of resonator 421. Similarly the portions of electrodes 440 and 441 that comprise part of resonator 423 could be fabricated to be thicker than the portions of these electrodes that comprise part of resonator 422 and thus would cause the resonant frequency of resonator 423 to be slightly lower than the resonant frequency of resonator 422. The thicknesses of the other layers of material in the device could similarly be altered on one half of the device relative to the other half and thus alter the filter characteristics for the combination. One can use this ability to alter the properties of one pair of resonators relative to the other pair of resonators to facilitate the design of filters having desired characteristics.

FIG. 4 depicts a device that may be operated with its input and output port in a balanced configuration, i.e. the two input connections that provide an input port can receive signals that are balanced with respect to ground. The output port may be operated in a similar manner. The input and output ports could, instead, be configured to receive and send signals that are unbalanced with respect to ground, i.e. in which one of the two connectors of each port is grounded.

In this instance electrodes 403 and 407 could be internally connected electrically and connected to ground via connectors 405 and 430. In a manner similar to that of FIG. 5, FIG. 6 depicts the electrode layers in the configuration in which electrodes 403 and 407 are contiguous portions of the same layer 601 of conducting material. In this circumstance, layer 601 of conducting material has a void 602 from which the conducting material is excluded. Void 602 removes the capacitance that otherwise would be exist between conducting layer 601 and electrode 441 and avoids the creation of a parasitic resonator that might otherwise be formed by electric fields from the area of the void to the underlying portion of electrode 441. If the effective acoustic and electrical distances between electrode 441 and conducting layer 601 are large enough such that the capacitance and parasitic resonator effects are insignificant, then layer 601 need not include void 602.

The length and width of conducting layer 601 need not be limited in the manner depicted in FIG. 6 but, instead, could extend well beyond the area covered by electrodes 404 and 427, e.g. across the entire lateral dimensions of the device. However, in that instance, conducting layer 601 should also include voids underlying the tabs extending from the sides of electrodes 404 and 427 in order to avoid the creation of parasitic resonators underlying these tabs.

Although most of the embodiments of the invention described above are depicted as being supported upon a substrate by a sequence of layers of material that act as an acoustic isolator or acoustic mirror or reflector, it should be understood that these embodiments could, instead, be fabricated as thin membranes that are not supported on a substrate by means of an acoustic isolator. For example the membrane could be supported at its periphery by a robust structure in the manner described in U.S. Pat. Nos. 3,694,677 and 4,320,365.

Figure 10:
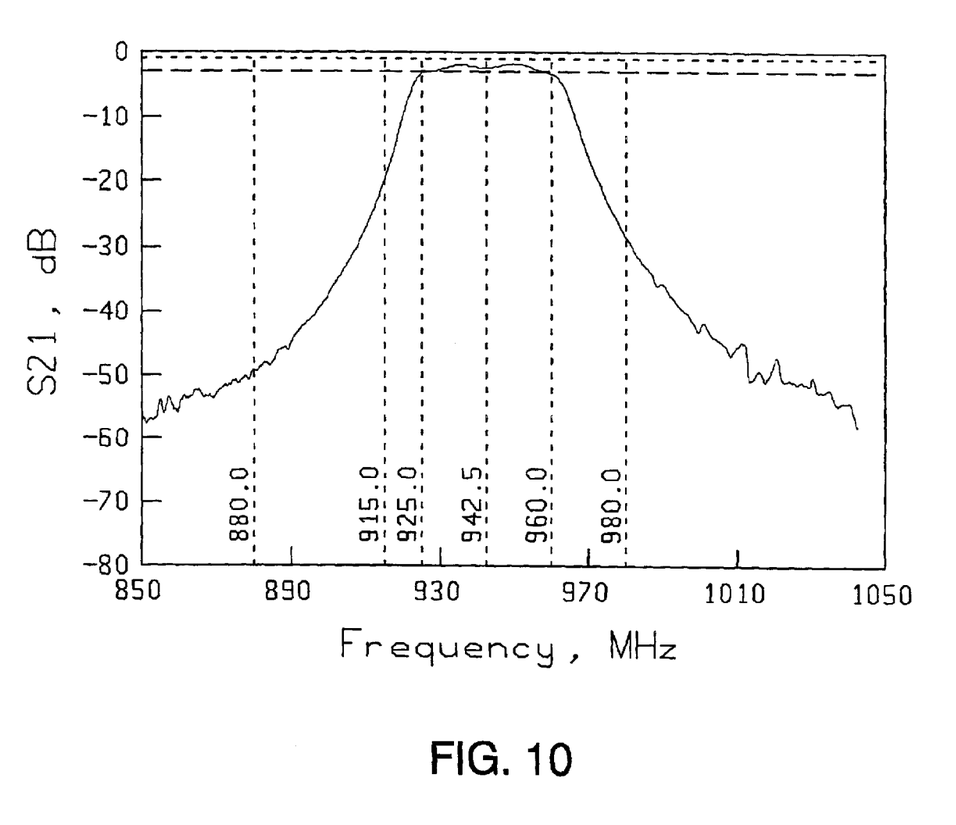
FIG. 10 depicts the transfer characteristic of a similar filter designed and fabricated to provide a filter pass-band centered at 942.5 Mhz.
Figure 12:
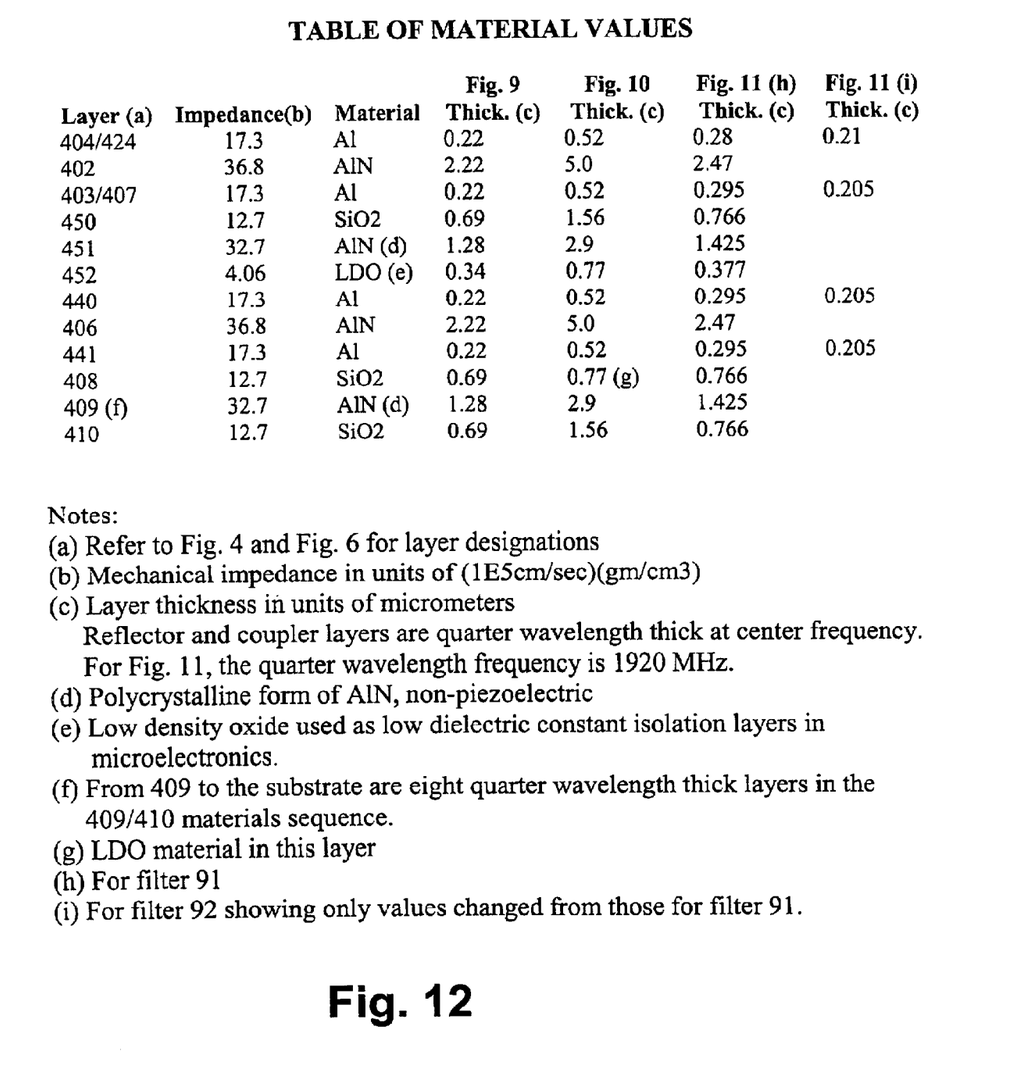
FIG. 12 is a table listing various parameters for filters described in this specification.

FIGS. 9 and 10 depict the transfer characteristics of two of devices of this invention having the configuration depicted in FIG. 4 with the electrodes configured as depicted in FIG. 6. FIG. 12 contains a table that lists the type of material in and the the thicknesses of, various layers of these devices.

Figure 7:
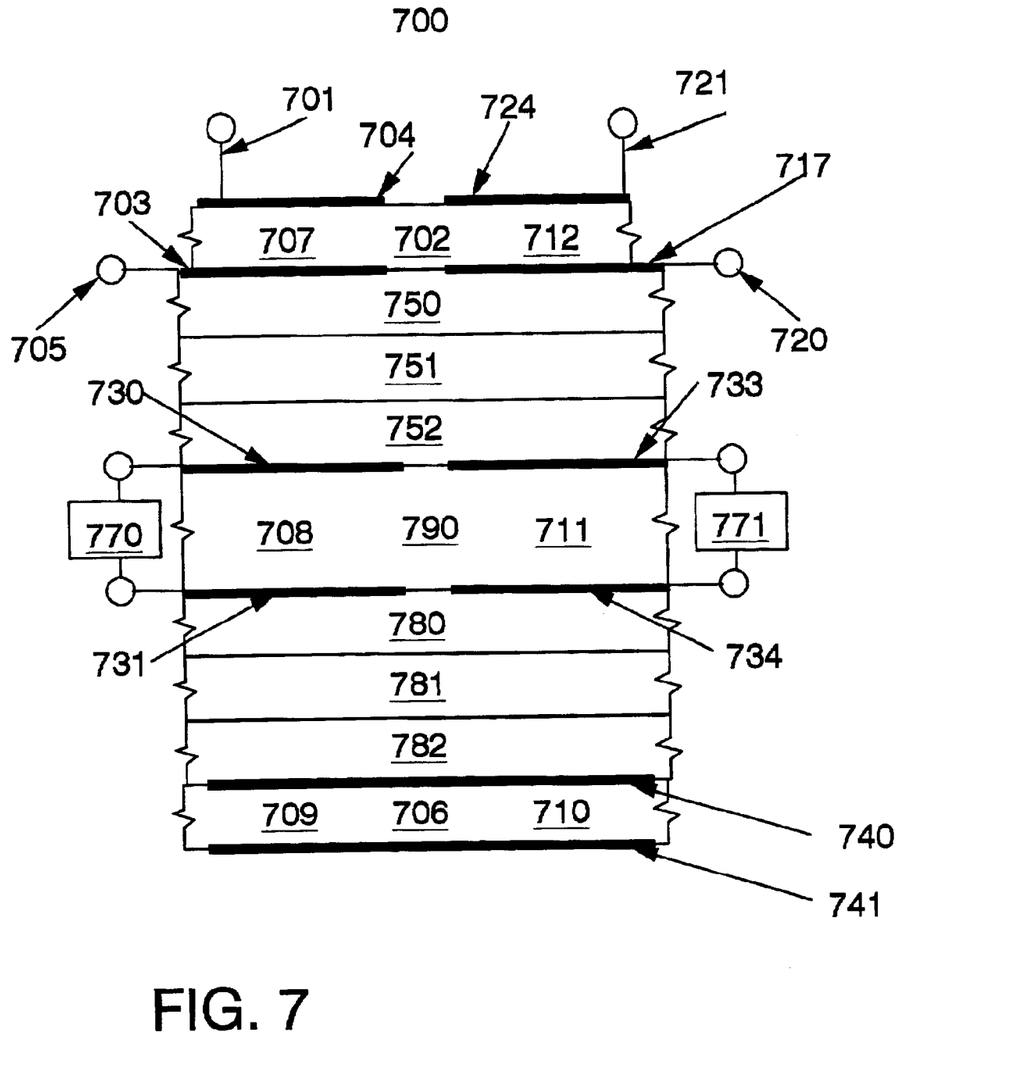
FIG. 7 depicts another embodiment of the invention that includes additional resonators in the stacks of resonators, which additional resonators can be electrically connected to external impedances which may be used to alter the properties of the filter.

The basic concept of this invention may be extended to more complex structures. For example, FIG. 7 depicts device 700 that includes two, side by side, stacks of acoustically coupled resonators with the two stacks connected in series to provide input and output ports at the upper surfaces of the stacks. Referring to FIG. 7, electrodes 703 and 704 together with the portion of piezoelectric layer 702 sandwiched between the overlapping portions of electrodes 703 and 704 form acoustic resonator 707 with input connectors 701 and 705. Electrodes 724 and 717 together with the portion of piezoelectric layer 702 sandwiched between the overlapping portions of electrodes 724 and 717 form acoustic resonator 712 with output connectors 720 and 721.

Electrodes 730 and 731 together with the portion of piezoelectric layer 790 that is sandwiched between the overlapping portions of electrodes 730 and 731 form acoustic resonator 708 and electrodes 733 and 734 together with the portion of piezoelectric layer 790 that is sandwiched between the overlapping portions of electrodes 733 and 734 form acoustic resonator 711. The portions of electrodes 740 and 741 together with the portion of piezoelectric layer 706 that underlie resonator 708 form resonator 709 and the respective portions that underlie resonator 711 form resonator 710. Because electrodes 740 and 741 encompass both resonators 709 and 710, the two stacks of resonators are electrically connected together in series. In a manner similar to that depicted in FIG. 5, one or the other of electrodes 740 or 741 would include a void in the conducting layer so that a parasitic resonator would not be created in the region encompassed by the void.

Intervening layers 750, 751 and 752 are made of materials having alternating high and low values of acoustic impedance and these layers control the amount of the acoustic coupling between resonators 707 and 708 and between resonators 711 and 712. Similarly, intervening layers 780, 781 and 782 control the amount of the acoustic coupling between resonators 708 and 709 and between resonators 710 and 711. Although FIG. 7, in each instance, depicts three intervening layers, it should be understood that different numbers of layers could, instead, be used to control the degree of acoustic coupling between the various acoustic resonators. As depicted in FIG. 7, external impedances such as loads 770 and 771 could be electrically connected to one or more of the resonators of this device to alter and adjust the characteristics of the filter formed by connection in series of the side by side stack of resonators.

Although resonators 708 and 711 are described above as being comprised of the respective portions of piezoelectric layer 790 bounded by electrodes 730 and 731 and by electrodes 733 and 734, these portions of the piezoelectric layer having a thickness of one-half an acoustic wavelength, or an odd multiple thereof, and which underlie resonators 707 and 712 respectively, could still function as acoustic resonators in the absence of electrodes 730, 731, 733 and 734. Furthermore, layer 790 need not be made of a piezoelectric material in order for these portions of the layer to function as acoustic resonators. One would, however, then be unable to alter the properties of resonators 708 and 711 by electrically connecting external impedances to these resonators. If no external loads are attached to resonators 708 and 711, the electrodes that bound resonators 708 and 711 can be eliminated and then these resonators may have thicknesses of one half an acoustic wavelength or any integral multiple thereof. The comment in the preceding sentence applies to each of the resonators in the configurations described in this specification whenever the resonator is not electrically connected to another resonator, port or other device.

Resonators 707, 712, 709 and 710, however, have to have thicknesses of approximately one-half an acoustic wavelength or an odd multiple thereof in order that a non-zero voltage be produced, at resonance, between the bounding electrodes.

Although the embodiment depicted on FIG. 7 is not supported upon a substrate by a series of layers constituting an acoustic reflector or isolator, it should be understood that the device could be supported in this manner.

Figure 11:
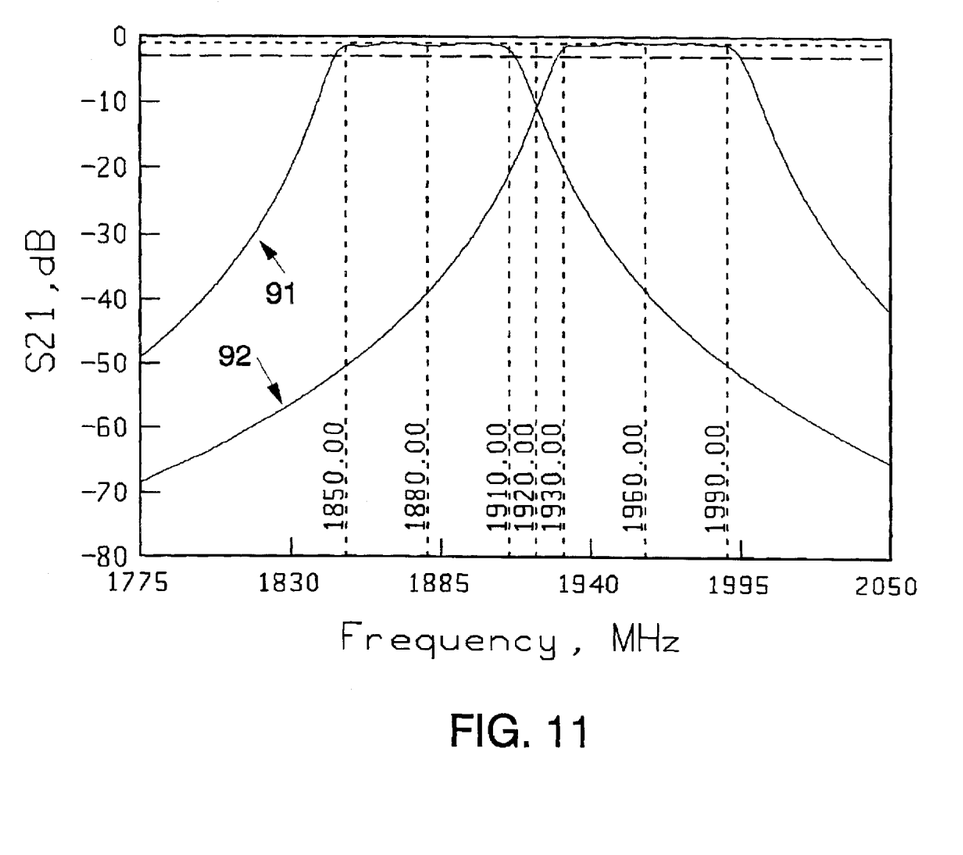
FIG. 11 displays the filter transfer characteristic calculated for a first filter comprised of a pair of acoustically coupled resonators electrically connected to a second pair of acoustically coupled resonators, and for a second filter which is the same has the first filter except that the thickness of each of the electrodes has been increased by a small amount.

FIG. 11 depicts transmission coefficients, $S_{21}$, calculated for filters having the configuration depicted in FIG. 4 with the layers having the thicknesses and compositions listed in FIG. 12. Curve 91 depicts the coefficient for the layers listed in FIG. 12 for filter 91 and curve 92 depicts the coefficient for the layers listed in FIG. 12 for filter 92. The only differences in the construction of the devices are differences in the thicknesses of the electrodes bounding the resonators. Changing the thicknesses of these electrodes changes the resonant frequencies of the resonators and, as indicated in FIG. 11, shifts the center frequency of the pass-band of the filter. When only a few layers of intervening material control the coupling between the resonators, changes made to the intervening layers alter the degree of coupling and, as a consequence, the shape of the pass-band. However, as illustrated in FIG. 11, it is the acoustic dimensions of the resonators, themselves, that primarily control the frequency at which the pass-band of the filter is located. It is only when a device utilizes a large number of intervening layers, such as that disclosed by Chin et al., in U.S. Pat. No. 4,349,796, that the properties of the intervening layers, alone, determine the frequency at which the pass-band is located.

The curves depicted in FIG. 11 also illustrate that one can fabricate a number of filters upon a single wafer and adjust the center frequency of the pass-band of each filter simply by altering only the thickness of the electrodes in each filter without altering the parameters of the other layers of the filters. As a consequence, on a single wafer one can fabricate many filters and adjust the center frequency of the pass-band of the individual filters simply by altering the thicknesses of the resonator electrodes as part of the fabrication process.

In the devices described above, if the piezoelectric layers have high piezoelectric coupling coefficients, and the input and output ports are loaded sufficiently by the impedances of the external electrical circuitry, then the width of the pass-band of each loaded resonator will be relatively broad. If the coupling between the various resonators also is substantial, i.e. approximately critically-coupled or over-coupled, then the bandwidth of the filter may be sufficiently broad such that the bandwidth is determined not only by the frequency responses of the coupled resonators, but also by the frequency response of the intervening layers that control the coupling between the various resonators. Such a circumstance can arise, for example, with as few as five to seven intervening quarter-wave layers of material between the resonators when the piezoelectric layers are made of a material such as $LiNbO_3$ which has a high piezoelectric coupling coefficient. In such a circumstance, the parameters of the resonators as well as of the intervening layers must be selected so as to obtain the desired width and shape of the pass-band.

All of the embodiments described above are two-port devices in which a signal is input to the input port and the device filters the signal that passes to the output port and allows a substantial amount of the input signal to be output at the output port only if the signal frequency lies within the pass-band of the device. However, it should be understood that each of these devices could, instead, be operated as a one port device in which the variation with change in frequency of the input impedance at the single port of the device is used as a filter to discriminate between signals having different frequencies. In such an instance, the second port may be connected to nothing and, in effect, not exist, or the second port may be connected to a terminating load. Accordingly, the term filter as used herein should be understood to encompass both one and two port devices.

As used in the claims, the phrase "contiguous intervening layers of differing materials" means layers of material for which some portion of each layer of material is physical contact with a portion of the immediately adjacent layer of material and means that the material in each layer is different from the material in the immediately adjacent layer of material. Nothing in the foregoing is intended to require the material in any one layer to be different than the material in any other layer that is not contiguous with that layer and is not intended to mean that the lateral boundaries of any one layer need necessarily coincide with the lateral boundaries of any other layer.

As used in the claims, the words "disposed above or below" refer to directions that are substantially normal to the thin layers of piezoelectric material and the thin layers of conduction materials that comprise the acoustic, piezoelectric resonators.

What is claimed is:

1. A microwave filter comprising:

a first piezoelectric acoustic, bulk wave, resonator having a piezoelectric layer made of an insulating material;

a second piezoelectric acoustic, bulk wave, resonator having a piezoelectric layer made of an insulating material, the second acoustic resonator being acoustically coupled to the first acoustic resonator and disposed above or below the first acoustic resonator; and a plurality of contiguous intervening layers of differing materials located between the first acoustic resonator and the second acoustic resonator, the contiguous intervening layers acoustically coupling the first acoustic resonator with the second acoustic resonator.

2. The microwave filter of claim 1 wherein the first acoustic resonator and the second acoustic resonator are acoustically either approximately critically coupled or over-coupled.

3. The microwave filter of claim 2 having a signal input port and a signal output port, the first acoustic resonator being electrically connected to the signal input port and the second acoustic resonator being electrically connected to the signal output port.

4. The microwave filter of claim 1 and further comprising:

a substrate;

an acoustic reflector; and the first and second acoustic resonators and the plurality of intervening layers being supported upon the substrate by the acoustic reflector.

5. A microwave filter comprising:

a first piezoelectric acoustic, bulk wave, resonator;

a second piezoelectric acoustic, bulk wave, resonator acoustically coupled to the first acoustic resonator and disposed above or below the first acoustic resonator;

a third piezoelectric acoustic, bulk wave, resonator electrically connected to the second acoustic resonator;

a fourth piezoelectric acoustic, bulk wave, resonator acoustically coupled to the third acoustic resonator and disposed above or below the third acoustic resonator;

a first plurality of contiguous intervening layers of differing materials located between the first acoustic resonator and the second acoustic resonator and affecting the amount of the acoustic coupling between the first and second acoustic resonators; and a second plurality of intervening layers of material located between the third acoustic resonator and the fourth acoustic resonator and affecting the amount of the acoustic coupling between the third and fourth acoustic resonators.

6. The microwave filter of claim 5 and further comprising:

a substrate;

an acoustic reflector; and the first, second, third and fourth acoustic resonators and the first and second plurality of intervening layers being supported upon the substrate by the acoustic reflector.

7. The microwave device of claim 5 in which the first, second, third and fourth acoustic resonators each has a piezoelectric layer made of an insulating material.

8. The microwave device of claim 5 having a signal input port and a signal output port, the first acoustic resonator being connected to the signal input port and the fourth acoustic resonator being connected to the signal output port.

9. The microwave device of claim 5 in which at least two of the acoustic resonators include piezoelectric layers of material and electrodes, each of said resonators having a resonant frequency, at least one electrode of the first one of said at least two acoustic resonators having a thickness that differs from the thickness of at least one of the electrodes in the second resonator of said at least two acoustic resonators thereby offsetting the resonant frequency of the first one of said at least two acoustic resonators from the resonant frequency of the second one of said at least two acoustic resonators.

10. A microwave filter having a signal input port and a signal output port and comprising:
- a first acoustic, bulk wave, resonator that includes a piezoelectric layer of insulating material, the first acoustic resonator being electrically connected to the signal input port;
- a second acoustic, bulk wave, resonator acoustically coupled to the first resonator and disposed above or below the first acoustic resonator;
- a third acoustic, bulk wave, resonator that includes a piezoelectric layer of insulating material and that is acoustically coupled to the second resonator and disposed above or below the second acoustic resonator, the third acoustic resonator being electrically connected to the signal output port and the second acoustic resonator being located between the first and third acoustic resonators;
- a first plurality of contiguous intervening layers of differing materials located between the first acoustic resonator and the second acoustic resonator, the first plurality of contiguous intervening layers acoustically coupling the first acoustic resonator with the second acoustic resonator;
- a second plurality of contiguous intervening layers of differing materials located between the second and third acoustic resonators, the second plurality of contiguous intervening layers acoustically coupling the second acoustic resonator with the third acoustic resonator.

11. The microwave filter of claim 10 in which the second acoustic resonator includes a piezoelectric layer of material and bounding electrodes and in which the second acoustic resonator is electrically connected to an external load.

12. The microwave filter of claim 10 and further comprising:
- a substrate;
- an acoustic reflector; and
- the first, second and third acoustic resonators and the first and second plurality of intervening layers being supported upon the substrate by the acoustic reflector.

13. A microwave filter comprising:
- a first piezoelectric acoustic, bulk wave, resonator;
- a second piezoelectric acoustic, bulk wave, resonator, the second acoustic resonator being acoustically coupled to the first acoustic resonator and disposed above or below the first acoustic resonator; and
- a plurality of contiguous intervening layers of differing materials located between the first acoustic resonator and the second acoustic resonator, the contiguous intervening layers acoustically coupling the first acoustic resonator with the second acoustic resonator and the first acoustic resonator and the second acoustic resonator being acoustically either approximately critically coupled or over-coupled.

14. The microwave filter of claim 13 having a signal input port and a signal output port, the first acoustic resonator being electrically connected to the signal input port and the second acoustic resonator being electrically connected to the signal output port.

15. The microwave filter of claim 13 and further comprising:
- a substrate;
- an acoustic reflector; and
- the first and second acoustic resonators and the plurality of intervening layers being supported upon the substrate by the acoustic reflector.

16. An microwave acoustic device fabricated upon a wafer comprising:
- a first microwave filter fabricated upon the wafer and having a pass-band frequency and the first microwave filter comprising:
  - a first piezoelectric acoustic, bulk wave, resonator having a conducting electrode;
  - a second piezoelectric acoustic, bulk wave, resonator, the second acoustic resonator being acoustically coupled to the first acoustic resonator and disposed above or below the first acoustic resonator; and
  - a plurality of contiguous intervening layers of differing materials located between the first acoustic resonator and the second acoustic resonator and affecting the amount of the acoustic coupling between the first and second acoustic resonators;
- and a second microwave filter fabricated upon the wafer and having a pass-band frequency and the second microwave filter comprising:
  - a first piezoelectric acoustic, bulk wave, resonator having a conducting electrode;
  - a second piezoelectric acoustic, bulk wave, resonator, the second acoustic resonator being acoustically coupled to the first acoustic resonator and disposed above or below the first acoustic resonator; and
  - a plurality of contiguous intervening layers of differing materials located between the first acoustic resonator and the second acoustic resonator and affecting the amount of the acoustic coupling between the first and second acoustic resonators;
  - wherein the thickness of the conducting electrode in the first piezoelectric resonator of the first microwave filter differs from the thickness of the conducting electrode in the first piezoelectric resonator of the second microwave filter, whereby said difference in thicknesses causes the pass-band frequency of the first microwave filter to be shifted relative to the pass-band frequency of the second microwave filter.

* * * * *